(12) United States Patent
Yun et al.

(10) Patent No.: US 8,353,628 B1
(45) Date of Patent: Jan. 15, 2013

(54) METHOD AND SYSTEM FOR TOMOGRAPHIC PROJECTION CORRECTION

(75) Inventors: Wenbing Yun, Walnut Creek, CA (US);
Ying Xu, San Ramon, CA (US);
Frederick W. Duewer, Albany, CA (US); Mason Freed, Pleasant Hill, CA (US); Chao-chih Hsu, Pleasant Hill, CA (US)

(73) Assignee: Xradia, Inc., Pleasanton, CA (US)

( * ) Notice: Subject to any disclaimer, the term of this patent is extended or adjusted under 35 U.S.C. 154(b) by 0 days.

(21) Appl. No.: 12/631,739

(22) Filed: Dec. 4, 2009

Related U.S. Application Data

(60) Provisional application No. 61/119,935, filed on Dec. 4, 2008.

(51) Int. Cl.
*G01D 18/00* (2006.01)
*A61B 6/00* (2006.01)

(52) U.S. Cl. .............................. 378/207; 378/21; 378/22

(58) Field of Classification Search .................... 378/22, 378/43
See application file for complete search history.

(56) References Cited

U.S. PATENT DOCUMENTS

| | | | | |
|---|---|---|---|---|
| 3,692,413 A | * | 9/1972 | Marcy et al. .................. 356/500 |
| 4,703,424 A | * | 10/1987 | Gullberg et al. ................. 378/14 |
| 4,710,875 A | * | 12/1987 | Nakajima et al. ............. 378/162 |
| 4,812,983 A | * | 3/1989 | Gullberg et al. ................ 378/14 |
| 4,858,128 A | * | 8/1989 | Nowak ........................... 382/131 |
| 5,023,894 A | * | 6/1991 | Yamashita et al. ................ 378/4 |
| 5,214,578 A | * | 5/1993 | Cornuejols et al. ........... 378/207 |
| 5,307,264 A | * | 4/1994 | Waggener et al. ............... 378/14 |
| 5,390,112 A | * | 2/1995 | Tam ................................ 378/17 |
| 6,011,828 A | * | 1/2000 | Hardy et al. .................... 378/65 |
| 6,130,517 A | * | 10/2000 | Yuan et al. ..................... 318/640 |
| 6,466,638 B1 | * | 10/2002 | Silver et al. ....................... 378/4 |
| 7,215,736 B1 | | 5/2007 | Wang et al. |
| 7,535,193 B2 | | 5/2009 | Xu |
| 2001/0045810 A1 | * | 11/2001 | Poon et al. ..................... 318/649 |
| 2001/0053196 A1 | * | 12/2001 | Sai ................................. 378/34 |
| 2003/0016781 A1 | * | 1/2003 | Huang ............................ 378/41 |
| 2003/0223536 A1 | * | 12/2003 | Yun et al. ........................ 378/45 |
| 2005/0129169 A1 | * | 6/2005 | Donnelly et al. ................. 378/5 |
| 2005/0226376 A1 | * | 10/2005 | Yun et al. ........................ 378/62 |
| 2007/0172025 A1 | * | 7/2007 | Seto ............................... 378/18 |
| 2008/0309276 A1 | * | 12/2008 | Xu ................................ 318/570 |

OTHER PUBLICATIONS

Mayo et al., X-ray phase-contrast microscopy and microtomography, Optics Express, vol. 11, No. 19, Sep. 2003, pp. 2289-2302.*
Shin et al., Techniques for Measuring Error Motions of a Precise Rotational Stage, International Conference on Control, Automation and Systems, Oct. 2007, pp. 2740-2743.*

(Continued)

*Primary Examiner* — Alexander H Taningco
(74) *Attorney, Agent, or Firm* — Houston & Associates, LLP

(57) ABSTRACT

The position of the sample is measured and used to correct for any off-axis motion during tomography using x-ray projection microscope system with a rotation stage system. The position is sensed using a precision-machined, low-CTE gold-coated cylinder or disc and three to five capacitive distance sensors. The correction can then be performed purely as image processing in software, by applying an appropriate shift in X and Y of the captured x-ray projections. A calibration is often necessary for each system (gold disc plus sensors plus sample stage) to account for any machining errors of the gold disc or positioning errors of the capacitive sensors. This calibration should also be repeated whenever any maintenance is performed on the metrology setup.

23 Claims, 3 Drawing Sheets

OTHER PUBLICATIONS

Grejda, Robert, et al., "Techniques for calibrating spindles with nanometer error motion," Precision Engineering 29 (2005) 113-123.

Kim, Jinho, et al., "The Analysis of Radial/Axial Error Motion on a Precision Rotation Stage," International Journal of Electrical, Computer, and Systems Engineering, vol. 1, No. 4, 2007, pp. 248-252.

* cited by examiner

METHOD AND SYSTEM FOR TOMOGRAPHIC PROJECTION CORRECTION

RELATED APPLICATIONS

This application claims the benefit under 35 USC 119(e) of U.S. Provisional Application No. 61/119,935, filed on Dec. 4, 2008, which is incorporated herein by reference in its entirety.

BACKGROUND OF THE INVENTION

Three dimensional (3D) x-ray and transmission electron microscope imaging with computed tomography (CT) require high three dimensional positional precision when rotating the sample under investigation between the series of transmission images, also known as projections, that are generated to perform the subsequent tomographic reconstruction. The effect of unwanted sample movement due to the imperfections of the rotation axis movement between different projections must be corrected typically below the imaging resolution of the microscope to enable a tomographic reconstruction without artifacts due to misregistered projections. At least one such x-ray tool, as described in U.S. Pat. No. 7,215,736, requires that the correction of the displacement of the sample due to rotation of a sample be accurate to within tens of nanometers in all three dimensions.

Such precision is difficult to achieve in conventional rotating stages due to random errors from bearings and spindle wobble and play, as well as manufacturing variations in the motor housing and the dimension and smoothness of the stage assembly attached to the motor. Furthermore, no matter how accurate the components can be made, some portion or all of it must be constructed out of typical engineering materials, which in general have significant thermal expansion characteristics.

U.S. Pat. No. 7,535,193 describes a rotating stage assembly that can be used to perform high precision position error correction for x-ray and transmission electron microscope tomographic imaging. It continuously senses and then corrects stage rotation and translation errors. It performs these corrections by sensing using five sensors, placed to measure the adjustments for five corresponding actuators, which adjust the entire stage to a reference frame, maintaining the position accuracy of the rotation axis of the stage. This implementation represents an active spindle correction in closed loop feedback that acts as a near perfect spindle.

Another solution implemented in the past places an X/Y/Z stage, which holds the sample holder, on top of a rotation (theta) stage with a metrology reference disc. This configuration allows the sample to be positioned on the axis of rotation of the theta stage. The problem with this configuration is that the theta stage is far from sample stage, leading to higher sample location errors. Moreover, active correction using the X/Y/Z stage on top of the theta stage is generally not possible, because existing X/Y/Z stages have excessive tip/tilt and runout errors during motion beyond the positional accuracy required for an active correction of spindle errors.

Another solution places the rotation (theta) stage with the metrology reference on top of a rotation X/Y/Z stage. Here, the theta stage is closer to sample, reducing the effects of tip/tilt on sample location. The problems with this configuration are that it is not possible to center the sample on the axis of rotation and active correction not possible because stage location is measured relative to the rotation stage only.

Another solution places the rotation (theta) stage with the metrology reference disc on top of a rotation X/Y/Z $\phi,\gamma$ stage. A further X/Y stage is placed on top of the theta stage and this X/Y piezo stage supports the sample holder. In this configuration, active correction is possible with X/Y piezo stage in between theta rotation stage and sample. This system is costly to design and implement, however.

SUMMARY OF THE INVENTION

The approaches describe above mainly fall into the category of active correction. They utilize the signals from the capacitive position sensors to adjust the X/Y/Z position of the sample using the X/Y/Z stages present in the system. These adjustments occur as images are being collected. Using this technique, X and Y sample shifts, as well as defocus issues, can all be corrected.

An alternative approach is passive (software) correction according to the invention. Here, during the reconstruction phase, recorded signals from the capacitive position sensors are used to translate each image to correct for X/Y errors due to the stage. This passive sensing method does not require changes in the acquisition process; it only requires that signals from the position sensors be determined and possibly stored with the images.

In an embodiment of the present invention, the position of the sample is measured and used to correct for any off-axis motion during tomography. The position is sensed using a precision-machined, low-coefficient-of-thermal-expansion (CTE) gold-coated cylinder or disc and three or more capacitive distance sensors. The correction can then be performed purely as image processing in software, by applying an appropriate shift in X and Y of the captured x-ray projections. A calibration is often necessary for each system (gold disc plus sensors plus sample stage) to account for any machining errors of the gold disc or positioning errors of the capacitive sensors. This calibration should also be repeated whenever any maintenance is performed on the metrology setup.

In general, according to one aspect, the invention features, tomography method comprising capturing a series of projections at different rotation angles of a sample with an x-ray or transmission electron microscope using a rotation stage, measuring displacements of the sample at the different rotation angles by reference to the rotation stage and a fixed reference point (such as a base of the rotation stage or optical bench of the microscope), shifting the projections by reference to the measured displacements, and performing tomographic reconstruction using the shifted projections.

In the preferred embodiments, capturing the series of projections comprises generating an x-ray beam and detecting the x-ray beam after transmission through the sample. The beam is collimated and directed onto the sample with a condenser. A zone plate lens is use to form the image on the detector.

Measuring displacements of the sample preferably comprises measuring linear and/or rotational displacements of the sample using position sensors, such a capacitive sensors, mounted between the rotation stage, such a metrology disc, and the fixed reference point.

The projection image data is preferably stored with sensor data generated from the position sensors for the angle corresponding to the angle at which the associated projection image data were generated. Also calibration is preferably performed by measuring displacements of a sample holder at different rotation angles and determining offet and sensitivity information for position sensors that measure displacement between the rotation stage and the fixed reference point.

In general, according to another aspect, the invention features, a tomography system comprising: a rotation stage for rotating a sample, a transmission microscope for capturing a series of projections at different rotation angles of the sample, position sensors for measuring displacements of the sample at the different rotation angles by reference to the rotation stage and a fixed reference point, and a controller for shifting the projections by reference to the measured displacements and then performing tomographic reconstruction using the shifted projections.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
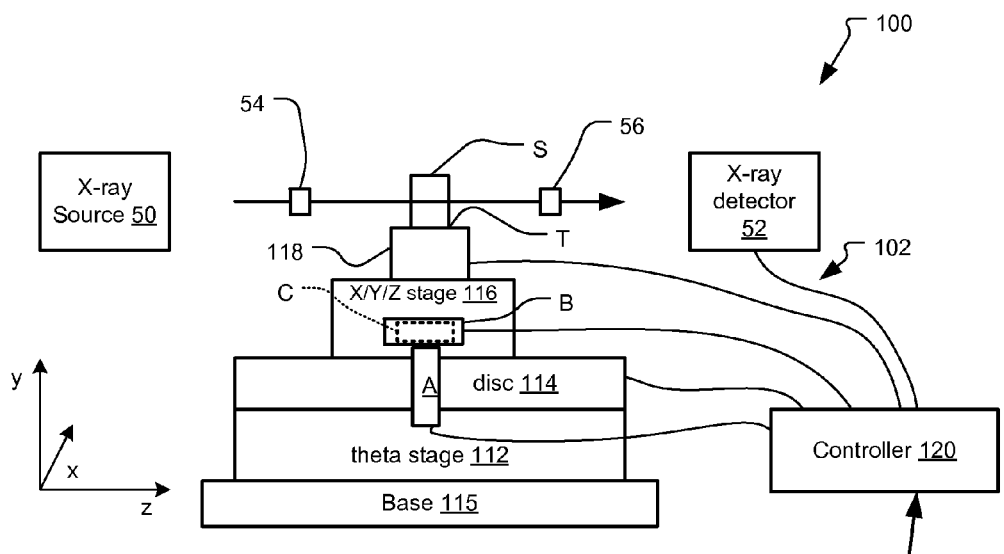
FIG. 1 is a schematic diagram of an x-ray projection microscope system with a rotation stage system according to the present invention.

FIG. 1 shows an x-ray projection microscope system 100 with a rotation stage system 102 according to a preferred embodiment of the present invention.

A radiation source 50 generates a beam B that is transmitted through a sample S. The transmitted beam is then detected by a detector 52.

In one embodiment, the radiation beam B is x-ray radiation that is intrinsically narrowband radiation or broadband radiation that is filtered by a bandpass filter to be narrowband, in the example of a transmission x-ray microscope. In this implementation, the source 50 is preferably a sealed tube, a rotating anode, a micro-focus, or a synchrotron radiation x-ray radiation source. A condenser lens 54, such as a capillary or zone plate optic, is preferably used that collects the radiation and projects the beam B onto the sample S.

In the example of an electron microscope, the condenser lens 54 is beam shaping magnets and the source 50 is an electron gun.

The beam B passing through the sample S is imaged onto a spatially resolved detector 52 by an objective lens 56, which is typically a Fresnel zone plate lens in the x-ray microscope embodiment.

Typically, the spatially resolved detector 52 has a high resolution having greater than 1024×1024 pixels. In some cases, a direct detection scheme is used in which a CCD detector or other electronic detector is used to detect the radiation, when soft x-rays are used. However, with higher energies, intervening scintillators are employed to enable detection of the radiation by first converting it into optical frequencies.

The sample S is held on a sample holder 118 and specifically a tip T of the sample holder 118. In one embodiment, the sample holder 118 is held on an X/Y/Z stage 116 that allows for positioning of the sample holder along the X, Y, and Z axes prior collection of the x-ray projections. The X/Y/Z stage 116 is held on a metrology disc or other metrology reference 114. The metrology disc 114 is rotated around the Y axis by a theta stage 112.

In the illustrated embodiment, three sensors A, B, C are used to measure displacements in the metrology disc 114 as it is rotated by the theta stage 112. Sensor A measures displacements of the disc 114 along the X axis. Sensors B and C measure displacements along the Y axis and tilting or rotation around the Z axis.

A controller 120 detects the responses of the sensors A, B, C as the theta stage 112 is rotated also under the control of the controller 120. The controller 120 also receives the x-ray images or projections that are detected by the detector 52.

The image data 123 detected by the x-ray detector 52 are stored by the controller 120 in a data storage 122. The data storage 122 stores the complete tomography data set, which includes a series of images or projections: image 1, image 2, . . . image n, and the corresponding sensor signals from each of the sensors A, B, C for each of the images.

In the preferred embodiment, the sensors A, B, C are capacitive position sensors that measure the relative position between the metrology disc 114, which is preferably a precision-machined, low-CTE gold cylinder, and a reference point. Typically, this reference point is the base 115 of the theta rotation stage 112, however other configurations exist.

Figure 2:
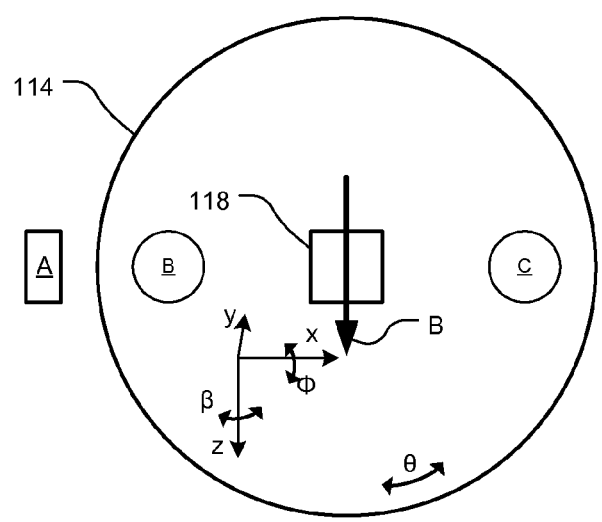
FIG. 2 is a schematic diagram top view showing the location of the sensors with respect to the metrology disc reference according to the present invention.

FIG. 2 is a top view showing the mechanical layout of the metrology disc 114 and the capacitive sensors A, B, C.

The capacitive position sensors A, B, C are used to deduce the position of the sample holder 118, and then use that deduced position is used to correct for any axis of rotation errors that occur as a result of rotation stage 112 non-idealities. For example, while rotating around the y-axis, the rotational stage 112 will often impart some linear motion (along any of the axes X, Y, Z) or some rotational motion (Φ,B), other than around the y-axis, to the sample holder 118.

Sensor A measures changes in the distance between the sensor A and the outer periphery of the disc 114 along the X axis. Sensors B and C measure the distance between the sensors and the top of the disc 114 on either side of the sample holder 118 along the X axis. Thus, together, sensor B and C measure displacements in the Y axis and rotation around the Z axis.

Three sensors yield measurements of 3 degrees of freedom out of the 6 total degrees of freedom. This limited number of sensors is capable of measuring projection image shifts, that is shifts along X and Y axes, and rotation about the Z axis. Shifts in Z axis and rotation about X axis do not affect the projection images, except in magnification/focus, which can be ignored.

In more detail, the position errors caused by the rotational stage 112 can cause five different types of artifacts in the captured (2D) x-ray images of the sample: left-right shift, up-down shift, rotation, magnification, and defocus (due to motion along the Z-axis). Because the angular stage errors are quite small (10s of μrad), the rotation of the image can be neglected; for example, in a 2000×2000 pixel image, the total error is 2000 tan(50 μrad)=0.1 pixels. For the same reason, the magnification effect can also be neglected. Therefore, only three factors matter for correction of sample position: horizontal shift, vertical shift, and defocus.

Ideally, the gold disc would be perfectly round (zero radial runout), have a perfectly flat top surface (zero axial runout), be perfectly centered on the axis of rotation, and be perfectly perpendicular to the axis of rotation. In this case, the complete displacement (X,Y,tilt) of the x-ray image could be determined from the 3 sensor signals $d_1$, $d_2$, $d_3$ from sensors A, B, C, respectively according to the following formulae:

$$d_1 = d_1^0 + x$$
$$d_2 = d_2^0 + r_{tip\text{-}tilt} \cdot \sin(\beta) - \gamma$$
$$d_3 = r_{tip\text{-}tilt} \cdot \sin(\beta) - \gamma \quad (1)$$

where $d_1$ through $d_3$ are the sensor-to-cylinder gap spacings, as measured by the 3 capacitive sensors. $d_1^0$ through $d_3^0$ are the "nominal" gap spacings, determined by the location adjustment of each capacitive sensor. x and y are the displacements of the disc in the X and Y directions, respectively. $\beta$ is the tilt about the Z axis. And $r_{tip\text{-}tilt}$ is the lateral distance from the center of the disc 114 to the center of the two tip-tilt sensors.

Solving Equations (1) for x,y,$\beta$:

$$x = d_1 - d_1^0 \quad (2)$$
$$\beta = \sin^{-1}\left[\frac{1}{2r_{tiptilt}}((d_2 - d_2^0) - (d_3 - d_3^0))\right]$$
$$y = \frac{1}{2}(d_2^0 + d_3^0 - d_2 - d_3)$$

Using Equations (2) along with sensor data and the physical cylinder parameters, the exact location and orientation of the gold disc 114 (and therefore the sample holder 118) could be calculated. However, given that the gold disc 114 is a manufactured object, it has non-zero manufacturing tolerances, and is therefore not "perfect". These non-idealities will change some of the terms in Equations (2). Examining the non-idealities of the disc 114 one at a time:

1. Radial runout (disc roundness). This non-ideality will cause the signal measured by $S_1$ to vary in a deterministic way as the disc 114 rotates. The error signal will be additive to the "real" signals for X movement.

2. Axial runout (top flatness). This will cause the signals from $S_2$ and $S_3$ to vary in a deterministic way as the disc 114 rotates. The error signal will be additive to the "real" signals for Y and 13 movement.

3. Axis of rotation tilt. If the entire rotation holder 118 is tilted relative to the capacitive sensors A, B, C, it will cause a fixed offset in $S_2$ and $S_3$ due to the sensors being closer or farther from the top of the disc 114. This tilt will also cause $S_1$ to become less sensitive to displacements, as a fraction of the total motion will be in a direction perpendicular to the capacitive sensors. The sensitivity of this sensor will be multiplied by $\cos(\xi_1)$, where $\xi_1$ is the angle of tilt.

4. Sensor tilt. If an individual sensor is tilted relative to the disc 114 (not perfectly parallel to the measurement surface), then its sensitivity will be multiplied by $\cos(\xi_2)$, where $\xi_2$ is the angle of tilt.

Because of #3 and #4 above, each sensor will measure distance with a slightly different (but constant) sensitivity and offset. And because of #1 and #2 above, each sensor will have an additive factor that varies with rotation angle $\theta$. So starting from Equations (2), adding the non-idealities mentioned above, and converting to sensor output voltages:

$$x = \alpha_1 V_1 - V_1^0(\theta) \quad (3)$$
$$\beta = \sin^{-1}\left[\frac{1}{2r_{tiptilt}}(\alpha_2 V_2 - \alpha_3 V_3 - V_2^0(\theta) + V_3^0(\theta))\right]$$
$$y = \frac{1}{2}(V_2^0(\theta) + V_3^0(\theta) - \alpha_2 V_2 - \alpha_3 V_3)$$

where $V_x$ are the output voltages from each sensor, $V_x^0(\theta)$ are the offset voltages for each sensor, and $\alpha_x$ are the individual sensitivities (distance/voltage) of each sensor. Note that the offset voltages $V_x^0(\theta)$ are now functions of theta, as the error terms due to the gold disc 114 imperfections have been lumped in.

For Passive Correction, only the X and Y shifts of the x-ray image matter:

$$x_{sift} = x - _s \sin(\beta)$$
$$y_{sift} = y \quad (4)$$

where $_s$ is the height of the sample above the gold disc 114. Combining Equations (3) and (4):

$$x_{sift} = \alpha_1 V_1 - v_1^0(\theta) - \frac{s}{2r_{tiptilt}}[\alpha_2 V_2 - \alpha_3 V_3 - V_2^0(\theta) + V_3^0(\theta)] \quad (5)$$
$$y_{sift} = \frac{1}{2}[V_2^0(\theta) + V_3^0(\theta) - \alpha_2 V_2 - \alpha_3 V_3]$$

Looking at Equations (5), it is apparent that each gold disc 114 must be fully characterized, to map out the voltage offsets $V_x^0(\theta)$ and sensitivities $\alpha_x$. Further, because these parameters are highly sensitive to sensor mounting, the assembly must not be disassembled or adjusted after calibration has been performed.

To calibrate the metrology system 100, multiple rotations of the disc 114 must be made while the sensor readings are recorded. At the same time, the X and Y location of the sample holder tip T must also be measured throughout the rotations.

To perform the calibration, start with Equations (5) and move all unknown quantities to the left side:

$$-V_1^0(\theta) - \frac{s}{2r_{tiptilt}}[V_3^0(\theta) - V_2^0(\theta)] = \quad (6)$$
$$x_{sift} - \alpha_1 V_1 \frac{s}{2r_{tiptilt}}[\alpha_2 V_2 - \alpha_3 V_3]\frac{1}{2}[V_2^0(\theta) + V_3^0(\theta)] =$$
$$y_{sift} + \frac{1}{2}[\alpha_2 V_2 + \alpha_3 V_3]$$

Note that the $\alpha_x$ terms still remain on the right side of Equations (6), because they are not equal and therefore cannot be divided out to the left side. Therefore, assume that all sensor sensitivities A, B, C are equal to each other, and equal to the manufacturer specified value. This is a key assumption for this preferred embodiment, that the sensors all have the same sensitivity. A survey of the calibration certificates for a sample of five typical capacitive sensors reveals a nominal gain of 100 µm/10V, and a typical gain error of 0.01%. Therefore, for these sensors, it can safely be assumed that all $\alpha$ values are the same. This eliminates the different $\alpha_x$ unknowns, and replaces them with a single known quantity, $\alpha$. This assumption will also introduce an error multiplier of $\cos(\xi_1)\cos(\xi_1)$, where $\xi_1$ and $\xi_2$ are the sensor and axis of rotation tilt angles. (See non-idealities #3 and #4 from the list on page 8.) Since, in the preferred embodiment, these tilt angles are small (assume a worst case tilt of 1 milliradian), the sensitivity will only change by $\cos^2(0.001)=0.0001\%$, which can safely be ignored.

For the purposes of calibration, "lump" all of the parameters on the left side of Equations (6) into two calibration functions:

$$f_1(\theta) = x_{sift} + \alpha\left[\frac{s}{2r_{tiptilt}}[V_2 - V_3] - V_1\right] \quad (7)$$

$$f_2(\theta) = y_{sift} + \frac{1}{2}\alpha[V_2 + V_3]$$

Given measured calibration data $x_{sift}$, $y_{sift}$, $V_1$, $V_2$, $V_3$, and the physical parameters $s$, $\alpha$, and $r_{tiptilt}$, values of $f_x(\theta)$ can be computed for all available rotation angles. If multiple rotations worth of calibration data are available, duplicated angular measurements can be averaged. Interpolation of $f_x(\theta)$ will need to be used to cover values of $\theta$ in-between calibration points.

Once this calibration is performed, values of $f_x(\theta)$ are available. Rearranging Equations (7) as a forward equation:

$$x_{sift} = f_1(\theta) - \alpha\left[\frac{s}{2r_{tiptilt}}[V_2 - V_3] - V_1\right] \quad (8)$$

$$y_{sift} = f_2(\theta) - \frac{1}{2}\alpha[V_2 + V_3]$$

For reference, here is a summary of the assumptions:

The errors introduced by the stage 112 are not so large that they cause the sample S to move out of the field of view. Because the metrology disc 114 cylinder must be mounted directly to the rotation stage 112, the X/Y/Z stage 116 must be in a fixed position for the entire duration of the tomography. Therefore, the rotation stage 112 must have a total error motion that is less than the field of view, to ensure that the sample stays visible throughout the rotation.

The defocus of the image (due to sample motion along the Z axis) is not too large. In the preferred embodiment, the sensitivity of defocus to motion in the Z direction is ~30× less sensitive than the sensitivity to X and Y shifts. So this is a reasonable assumption.

All three capacitive sensors A, B, C have the same sensitivity $$\left(\frac{\Delta d}{\Delta V}\right)$$

to position. This assumption implies that the sensors are manufactured identically, and also implies that they are mounted parallel to the measurement surface within 1 milliradian. This should be within the current manufacturing tolerance.

Figure 3:
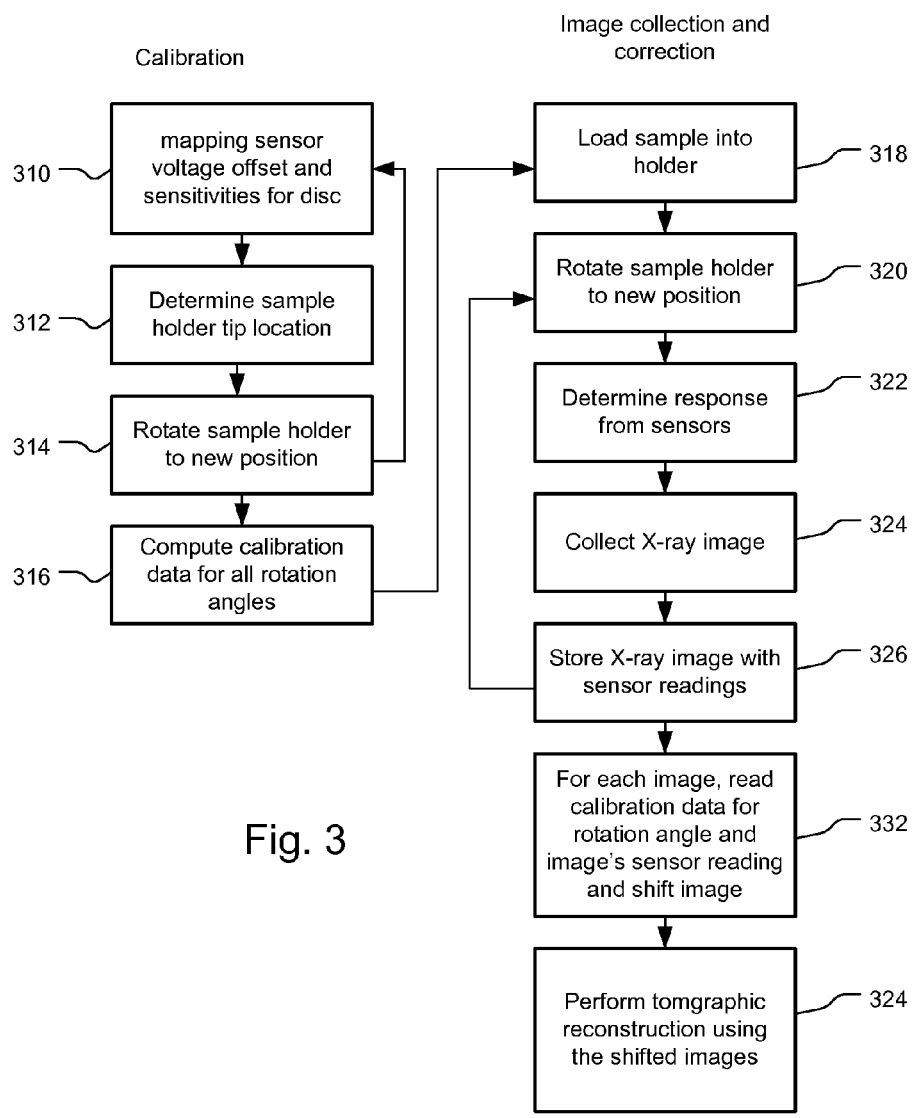
FIG. 3 is a flow diagram showing the method for capturing and aligning projections for tomographic reconstruction according to the present invention.

FIG. 3 illustrates the calibration process and the subsequent image correction method.

In step 310, the sensor output voltages are recorded for the disc 114 for each of the sensors A, B, C. In step 312, the sample holder tip's location is determined with respect to the image detected by the detector 52. Thus, the true position of the sample in the field of the image is not correlated to the response of the sensors A, B, C. Then, in step 314, the sample holder tip T is rotated to a new position by the theta stage 114 and the sensor output voltages are again mapped for the disc 114 in step 310 for the new position. These steps 310, 312, 314 are repeated until data are acquired for all of the relevant angular positions for the theta stage 114.

In step 316, the calibration data are computed for all of the rotation angles for the theta stage 114. For each of the angles used for the subsequent projections, angle 1-angle n, the data storage 122 holds calibration factors $f_1(\theta)$ and $f_2(\theta)$ offset and sensor sensitivity for each of the sensors A, B, C as part of the calibration dataset 125.

In step 318, the sample S is loaded into the sample holder 118. Then in step 320, the sample holder 108 is rotated to a new angular position. At the new angular position, the output from the sensors A, B, C is determined in step 322. Also, at the same time, the x-ray image is collected by the controller by receiving the response of the detector 52 in step 324. In step 326, the x-ray image is stored into the image data set 123 on the data storage 122 by the controller 120. Additionally, the output from each of the sensors A, B, C is stored in the data storage 122 in connection with the associated x-ray image as part of the image data set 123.

The process is repeated by performing steps 320-326, rotating the theta stage to a new angular position and then detecting the corresponding outputs from the sensors A, B, C and the x-ray image. This is repeated until all of the x-ray images or projections have been detected.

In step 332, for each image, the calibration data for the corresponding rotation angle is used to correct for the images positions along with the responses from the sensors A, B, C for that image. Specifically, the location of the image is corrected in the plane of the image to remove error introduced into the images from the theta stage. Finally, in step 324, the shifted images or projections are used to create a tomographic reconstruction of the sample.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tomography method comprising:
   loading a sample onto a holder that is held by a rotation stage;
   capturing a series of projections at different rotation angles of the sample with an x-ray or transmission electron microscope using the rotation stage to rotate the sample in a beam generated by the x-ray or transmission electron microscope;
   measuring displacements of the sample at the different rotation angles by measuring mechanical displacements of a metrology reference that is rotated by the rotation stage along with the sample, the mechanical displacements of the metrology reference being measured with respect to a fixed mechanical reference;
   shifting the projections by reference to the measured mechanical displacements with respect to the fixed mechanical reference; and
   performing tomographic reconstruction using the shifted projections.

2. A tomography method as claimed in claim 1, wherein capturing the series of projections comprises generating an x-ray beam and detecting the x-ray beam after transmission through the sample.

3. A tomography method as claimed in claim 2, further comprising forming an image on a detector with a zone plate lens.

4. A tomography method as claimed in claim 1, wherein measuring displacements of the sample comprises measuring linear displacements of the sample by measuring linear mechanical displacements of the metrology reference with respect to the fixed mechanical reference.

5. A tomography method as claimed in claim 1, wherein measuring displacements of the sample comprises measuring angular displacements of the sample by measuring angular mechanical displacements of the metrology reference with respect to the fixed mechanical reference.

6. A tomography method as claimed in claim 1, wherein measuring displacements of the sample comprises using position sensors mounted between the metrology reference and the fixed mechanical reference.

7. A tomography method as claimed in claim 6, wherein the position sensors are mounted to detect a position of the metrology reference, which is a disc, of the rotation stage.

8. A tomography method as claimed in claim 6, wherein the position sensors are capacitive sensors.

9. A tomography method as claimed in claim 6, further comprising storing projection image data with sensor data generated from the position sensors for the angle corresponding to the angle at which the associated projection image data were generated.

10. A tomography method as claimed in claim 1, further comprising performing calibration by measuring displacements of a sample holder at different rotation angles.

11. A tomography method as claimed in claim 10, further comprising determining offset and sensitivity information for position sensors that measure displacement between the metrology reference and the fixed mechanical reference at each of the different rotation angles.

12. A tomography system comprising:
a rotation stage for rotating a sample and a metrology reference;
a transmission microscope for capturing a series of projections at different rotation angles of the sample;
position sensors for measuring mechanical displacements of the sample at the different rotation angles by measuring displacements of the metrology reference with respect to a fixed mechanical reference for each of the projections; and
a controller for shifting the projections by reference to the measured mechanical displacements of the metrology reference with respect to the fixed mechanical reference and then performing tomographic reconstruction using the shifted projections.

13. A tomography system as claimed in claim 12, wherein the transmission microscope comprises an x-ray beam source and a detector for detecting the x-ray beam after transmission through the sample.

14. A tomography system as claimed in claim 13, further comprising a condenser for collimating and directing the beam onto the sample.

15. A tomography system as claimed in claim 14, further comprising a zone plate lens for forming an image on the detector.

16. A tomography system as claimed in claim 12, further comprising position sensors for measuring linear displacements of the sample by measuring linear mechanical displacements of the metrology reference with respect to the fixed mechanical reference.

17. A tomography system as claimed in claim 12, further comprising position sensors for measuring rotational displacements of the sample by measuring rotational mechanical displacements of the metrology reference with respect to the fixed mechanical reference.

18. A tomography system as claimed in claim 12, further comprising position sensors mounted between the rotation stage and the metrology reference.

19. A tomography system as claimed in claim 18, wherein the position sensors are mounted to detect a position of metrology reference, which is a disc.

20. A tomography system as claimed in claim 19, wherein the position sensors are capacitive sensors.

21. A tomography system as claimed in claim 18, wherein the controller stores projection image data with sensor data generated from the position sensors for the angle corresponding to the angle at which the associated projection image data were generated.

22. A tomography system as claimed in claim 21, wherein the controller stores offset and sensitivity information for the position sensors at each of the different rotation angles that were generated during a calibration process.

23. A tomography method comprising:
performing a calibration by measuring displacements of a sample holder with x-ray or transmission electron microscope having a rotation stage for the sample holder at different rotation angles and determining offset and sensitivity information for position sensors that measure mechanical displacement between a metrology reference of the rotation stage and a fixed mechanical reference at each of the different rotation angles;
capturing a series of projections at different rotation angles of a sample held on the sample holder with the x-ray or transmission electron microscope;
measuring displacements of the sample at the different rotation angles for each of the projections using the position sensors that measure mechanical position changes between the metrology reference and the fixed mechanical reference;
storing projection image data with sensor data generated from the position sensors for the angle corresponding to the angle at which the associated projection image data were generated; and
shifting the projections by reference to the measured mechanical position changes of the rotation stage with respect to the fixed mechanical reference and the offset and sensitivity information generated from the calibration;
performing tomographic reconstruction using the shifted projections.

* * * * *